US011111413B2

(12) United States Patent
Zhou et al.

(10) Patent No.: US 11,111,413 B2
(45) Date of Patent: Sep. 7, 2021

(54) CHEMICAL-MECHANICAL POLISHING SOLUTION HAVING HIGH SILICON NITRIDE SELECTIVITY

(71) Applicant: Anji Microelectronics Technology (Shanghai) Co., Ltd., Shangai (CN)

(72) Inventors: Wenting Zhou, Shanghai (CN); Jianfen Jing, Shanghai (CN)

(73) Assignee: ANJI MICROELECTRONICS TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/464,856

(22) PCT Filed: Jul. 25, 2017

(86) PCT No.: PCT/CN2017/094349
§ 371 (c)(1),
(2) Date: Aug. 23, 2019

(87) PCT Pub. No.: WO2018/099109
PCT Pub. Date: Jun. 7, 2018

(65) Prior Publication Data
US 2020/0017716 A1 Jan. 16, 2020

(30) Foreign Application Priority Data

Nov. 29, 2016 (CN) .......................... 201611070473.4

(51) Int. Cl.
*C09G 1/02* (2006.01)
*C09K 13/00* (2006.01)
*C09K 13/02* (2006.01)
*H01L 21/3105* (2006.01)

(52) U.S. Cl.
CPC ................ *C09G 1/02* (2013.01); *C09K 13/00* (2013.01); *C09K 13/02* (2013.01); *H01L 21/31053* (2013.01)

(58) Field of Classification Search
CPC .......... C09G 1/02; C09K 13/00; C09K 13/02; H01L 21/31053
USPC ................................ 252/79.4, 79.5; 438/693
See application file for complete search history.

(56) References Cited

U.S. PATENT DOCUMENTS

| 2008/0116171 | A1 | 5/2008 | Babu et al. | |
| 2009/0137124 | A1* | 5/2009 | Carter | H01L 21/31053 438/693 |
| 2016/0215170 | A1* | 7/2016 | Tamada | C09G 1/02 |
| 2016/0257853 | A1 | 9/2016 | Reiss et al. | |
| 2017/0088748 | A1* | 3/2017 | Stender | C09G 1/04 |

FOREIGN PATENT DOCUMENTS

| CN | 101065458 | 10/2007 |
| CN | 101407699 | 4/2009 |
| CN | 101665662 | 3/2010 |
| CN | 102046743 | 5/2011 |
| CN | 103387796 | 11/2013 |
| TW | 200426932 A | 12/2004 |

OTHER PUBLICATIONS

"Showing Compound Picolinic acid (FDB022926)" via https://foodb.ca/compounds/FDB022926 ; pp. 1-7, No date available.*
"Nomenclature of Aldehydes & Ketone" via https://chem.libretexts.org/Bookshelves/Organic_Chemistry/Supplemental_Modules_(Organic_Chemistry)/Aldehydes_and_Ketones/Nomenclature_of_Aldehydes_and_Ketones ; pp. 1-7; (Year: 2019).*
Wikipedia "Silica" via https://en.wikipedia.org/wiki/Silicon_dioxide ; pp. 1-20. (Year: 2020).*
Encyclopedia Britannica "Silica" via https://www.britannica.com/science/silica ; pp. 1-2 (Year: 2020).*
International Search Report and Written Opinion dated Oct. 18, 2017 in corresponding International Patent Application No. PCT/CN2017/094349, filed Jul. 25, 2017, 14 pages.
Office Action dated Jan. 27, 2021 in corresponding Taiwan Patent Application No. TW106132410, 8 pages.

* cited by examiner

*Primary Examiner* — Binh X Tran
(74) *Attorney, Agent, or Firm* — Dentons US LLP

(57) ABSTRACT

A chemical-mechanical polishing slurry having high Silicon Nitride removal rate selectivity includes abrasive particles and a compound containing one or more carboxyl groups. The polishing slurry has high SiN removal rate, low TEOS removal rate, and high removal rate selectivity of SiN to TEOS. The polishing slurry can significantly reduce the defects on Oxide surface which has an excellent market application prospect.

11 Claims, No Drawings ic layer is filled into these trenches. To ensure completely fill these trenches it often needs overfill Dielectric material on the top of Silicon Nitride film. And then the overburdened Dielectric material needs to be removed through chemical mechanical polishing process to expose the Silicon Nitride
CHEMICAL-MECHANICAL POLISHING SOLUTION HAVING HIGH SILICON NITRIDE SELECTIVITY

CROSS-REFERENCE TO RELATED APPLICATIONS

This application is a U.S. National Stage application of PCT/CN2017/094349, filed Jul. 25, 2017, which claims the benefit of Chinese Patent Application No. 201611070473.4, filed Nov. 29, 2016, each hereby incorporated by reference in its entirety.

FIELD OF THE INVENTION

The present invention relates to the chemical-mechanical polishing slurry field, more particularly to the chemical-mechanical polishing slurry having high Silicon Nitride removal rate selectivity.

BACKGROUND TO THE INVENTION

During semiconductor devices MFG process, the removal of Silicon Nitride layer is required at many steps, for example, in the forming of the separation structure, the Silicon Nitride as a kind of barrier layer needs to be removed. To date, however, the removal of such Silicon Nitride layer usually requires a wet etching treatment such as the mixture of phosphoric/nitric acid at a high temperature of about 150° C., rarely using a polishing step containing abrasive particles. During the shallow trench isolation (STI) process Silicon Nitride layer is deposited on the Silicon substrate, then shallow trench is formed Silicon Nitride by etching or photolithography, and then the Dielectric layer is filled into these trenches. To ensure completely fill these trenches it often needs overfill Dielectric material on the top of Silicon Nitride film. And then the overburdened Dielectric material needs to be removed through chemical mechanical polishing process to expose the Silicon Nitride layer. When the Silicon Nitride layer is exposed, the most area is covered by the Silicon Nitride. And then, the Silicon Nitride must be polished to obtain a highly flat and uniform surface.

At present, there are many researches on the polishing of Silicon Nitride layer, such as CN102604541 which proposes to increase removal rate (RR) selectivity of SiN to Oxide by using Silica particles, aryl dicarboxylic acid and phenylacetic acid compounds. But its Oxide removal rate (RR) is relatively high, while the selectivity of SiN to TEOS is relatively low. CN 1796482 proposes to increase the removal rate of SiN and the selectivity of SiN to Oxide by adding at least one from the group of formic acid, acetic acid, oxalic acid, adipic acid and lactic acid to form a 85% aqueous solution, however, it simply increases the removal rate of SiN without changing the removal rate of Oxide at the same time. CN101906270 provides polishing Slurry which improves the stability, shelf life and pot life of the polishing Slurry by using nitrogenous compounds containing cyclic structures, but the polishing performance is not involved.

It can be seen that the polishing mechanism is being emphasized all the time that Oxide polishing takes precedence over Silicon Nitride polishing in previous practices. So the Silicon Nitride layer is usually used as stop layer during the chemical-mechanical polishing process. The reason is that the overall polishing rate of the substrate decreases after the Silicon Nitride layer is exposed. However, with the advance of etching technology, the Oxide line width becomes smaller and it is expected that the polishing system has the selectivity that the Silicon Nitride polishing takes precedence over the Oxide polishing, which minimizes defects in the Oxide circuit formed on the substrate surface. Therefore, it is an urgent need in this field to find a kind of selective polishing Slurry with higher Silicon Nitride to Oxide removal rate selectivity.

SUMMARY OF THE INVENTION

In order to solve the above problems, the present invention proposes a chemical-mechanical polishing Slurry with high Silicon Nitride removal rate selectivity, wherein the polishing Slurry can provide a relatively high SiN polishing speed, a relatively low TEOS polishing rate and a relatively high removal rate selectivity of SiN to TEOS.

In particular, the present invention provides a chemical-mechanical polishing slurry with high Silicon Nitride removal rate selectivity, wherein, the chemical-mechanical polishing slurry has abrasive particles and a compound containing one or more carboxyl groups.

Preferably the abrasive particles are silica particles.

Preferably the better mass percentage concentration of the abrasive particles is 0.5~8 wt %, and preferably, 1%~5 wt %.

Preferably the compound containing one or more carboxyl groups is one or more selected from the group of pyridine compound, piperidine compound, pyrrolidine compound, pyrrole compound and all the derivatives of above compounds.

Preferably the compound containing one or more carboxyl groups is one or more selected from the group of 2-carboxyl pyridine, 3-carboxyl pyridine, 4-carboxyl pyridine, 2,3-dicarboxyl pyridine, 2,4-dicarboxyl pyridine, 2,6-dicarboxyl pyridine, 3,5-dicarboxyl pyridine, 2-carboxyl piperidine, 3-carboxyl piperidine, 4-carboxyl piperidine, 2,3-dicarboxyl piperidine, 2,4-dicarboxyl piperidine, 2,6-dicarboxyl piperidine, 3,5-dicarboxyl piperidine, 2-carboxyl pyrrolidine, 3-carboxyl pyrrolidine, 2,4-dicarboxyl pyrrolidine, 2,5-dicarboxyl pyrrolidine, 2-carboxyl pyrrole, 3-carboxyl pyrrole, 2,5-dicarboxypyrrole, 3,4-dicarboxypyridine, etc.

Preferably the mass percentage concentration of the compound containing one or more carboxyl groups is 0.01~0.5 wt %, and preferably 0.01~0.3 wt %.

Preferably the pH value of the chemical-mechanical polishing slurry is 1.5 units higher than the pKa1 of the compound containing one or more carboxyl groups, but pH is less than 6.5

Preferably the chemical-mechanical polishing slurry further comprises the pH adjustor and the bactericide.

Preferably the pH adjustor is one or more selected from the group of $HNO_3$, $KOH$, $K_2HPO_4$, and $KH_2PO_4$.

Preferably the bactericide is one or more selected from the group of 5-chloro-2-methyl-4-isothiazolin-3-ketone (CIT), 2-methyl-4-isothiazolinone (MIT), 1,2-Phenylpropanzothiazolinone (BIT), Iodopropargyl carbamate (IPBC), 1,3-dihydroxymethyl-5,5-methyl-heine (DMDMH), etc.

Preferably the mass percentage concentration of the bactericide is 0.02~0.2 wt %.

Compared with the prior art, the present invention has the following advantages:

1) The invention has a relatively high SiN removal rate and a relatively low TEOS removal rate and a relatively high removal rate selectivity of SiN to TEOS;

2) The invention can significantly reduce defects on Oxide surface.

DETAILED DESCRIPTION OF PREFERRED EMBODIMENTS

The formulas of embodiments and the comparative examples are given in table 1. All components are dissolved and mixed well with water to form 100% solution and pH of the mixture is adjusted to target by pH adjustor.

includes carboxyl and nitrogen structure at the same time, when the pH is 1.5 units higher than Pka1, nitrogen structure and the silica abrasive particles are mutually attracted so that the carboxyl structure is exposed. The carboxyl structure will enhance the interaction between abrasive particles and Silicon Nitride surface while reduce the interaction between the abrasive particles and TEOS surface. So Silicon Nitride RR is increased while TEOS RR is decreased. By using the polishing slurry with high selectivity of Silicon Nitride to TEOS, we can reduce the defects caused by Silicon Nitride

TABLE 1

Compositions of embodiments and comparative examples

| | Abrasive Particles | | Carboxyl Compound | | | Bactericide | | | SiN | TEOS | SiN/TEOS |
|---|---|---|---|---|---|---|---|---|---|---|---|
| | Name | concentration (%) | Name | Pka 1 | concentration (%) | Name | concentration (%) | pH | RR (A/min) | RR (A/min) | RR selectivity |
| Comparative example 1 | SiO$_2$ | 3 | | | | | | 2.5 | 23 | 623 | 0.04 |
| Comparative example 2 | SiO$_2$ | 3 | Hydroxyethyl 1,1-diphosphate | 1.2 | 0.05 | | | 2.5 | 405 | 426 | 0.95 |
| Comparative example 3 | SiO$_2$ | 3 | Ascorbic acid | 4.19 | 0.05 | | | 2.5 | 325 | 401 | 0.81 |
| Comparative example 4 | SiO$_2$ | 3 | 2-carboxyl pyridine | 1.0 | 0.05 | | | 2.5 | 256 | 611 | 0.42 |
| Embodiment 1 | SiO$_2$ | 3 | 2-carboxyl pyridine | 1.0 | 0.05 | CIT | 0.02 | 4 | 612 | 19 | 32.21 |
| Embodiment 2 | SiO$_2$ | 0.5 | 2,6-dicarboxyl pyridine | 2.1 | 0.01 | BIT | 0.05 | 5.2 | 451 | 14 | 32.21 |
| Embodiment 3 | SiO$_2$ | 1 | 3-carboxyl piperidine | 2.0 | 0.05 | MIT | 0.10 | 4.5 | 563 | 15 | 37.53 |
| Embodiment 4 | SiO$_2$ | 5 | 2,4-dicarboxyl piperidine | 2.1 | 0.04 | IPBC | 0.20 | 5.6 | 654 | 21 | 31.14 |
| Embodiment 5 | SiO$_2$ | 6 | 2-carboxyl pyrrolidine | 1.7 | 0.30 | DMDMH | 0.20 | 6 | 672 | 17 | 39.53 |
| Embodiment 6 | SiO$_2$ | 8 | 2,5-dicarboxyl pyrrolidine | 2.5 | 0.03 | MIT | 0.05 | 4.8 | 715 | 23 | 31.09 |
| Embodiment 7 | SiO$_2$ | 2 | 2-carboxyl pyrrole | 1.6 | 0.10 | BIT | 0.02 | 5 | 605 | 16 | 37.81 |
| Embodiment 8 | SiO$_2$ | 2 | 2,5-dicarboxypyrole | 2.6 | 0.05 | DMDMH | 0.02 | 5.3 | 587 | 15 | 39.13 |
| Embodiment 9 | SiO$_2$ | 2 | 2-carboxyl pyrrolidine | 1.0 | 0.50 | DMDMH | 0.02 | 4.3 | 664 | 18 | 36.89 |
| Embodiment 10 | SiO$_2$ | 2 | 2-carboxyl pyridine | 1.0 | 0.05 | DMDMH | 0.02 | 6.5 | 475 | 20 | 23.75 |

The polishing slurry formulated in table 1 was tested according to the following experimental conditions.

Specific polishing conditions: Polisher: Mirra Pad: IC1010, platen/head rotation speed: 93/87 rpm, polishing pressure: 1.5 psi. Slurry flow rate is 150 ml/min. 8" Silicon Nitride and TEOS wafers are polished for 1 min and then cleaned, dried and measured to get the polishing result.

It can be seen from the results of comparative example 1 that Silicon Nitride removal rate (RR) is very low while TEOS RR is relatively high when using the Silica abrasive only. The selectivity of Silicon Nitride to TEOS is in the reverse direction. It can be seen from the results of embodiments and comparative example 2 and 3 that, compared with the slurry containing other carboxylic acids and other heterocyclic acids, the RR of Silicon Nitride of the present invention is significantly increased, the RR of TEOS is reduced and the RR selectivity of Silicon Nitride to TEOS is very high. According to the results of embodiments and comparative example 4, when the pH is 1.5 units higher than Pka1(1.0) of 2-carboxypyridine, Silicon Nitride RR is relatively high, while TEOS RR is relatively low, hence RR selectivity of Silicon Nitride to TEOS is high. The molecular structure of the carboxylic compound in this invention as the stop layer in STI polishing process. In addition, in the structure where TEOS is used as the stop layer, using the polishing slurry in this invention can provide high removal efficiency of Silicon Nitride It should be noted that the embodiment of the present invention has better enforcement and there is no any limit to the present invention. Any technicians familiar with this field may use the above revealed technical content for equivalent embodiment by changing or modifying the embodiment of the present invention. If not out of range of the technology solution of the present invention, the changing, equivalent changing or modifying according to the technical essence of the present invention still belongs to the scope of the technology solutions of the present invention.

The invention claimed is:
1. A chemical-mechanical polishing slurry consisting of silica particles, a compound containing one or more carboxyl groups, a pH adjustor, and water, wherein the compound containing one or more carboxyl groups is selected from the group consisting of a pyridine compound, a piperidine compound, a pyrrolidine compound, a pyrrole compound, and any derivative and/or combination thereof.

2. The chemical-mechanical polishing slurry as claimed in claim 1, wherein the compound containing one or more carboxyl groups is selected from the group consisting of 2-carboxyl pyridine, 3-carboxyl pyridine, 4-carboxyl pyridine, 2,3-dicarboxyl pyridine, 2,4-dicarboxyl pyridine, 2,6-dicarboxyl pyridine, 3,5-dicarboxyl pyridine, 2-carboxyl piperidine, 3-carboxyl piperidine, 4-carboxyl piperidine, 2,3-dicarboxyl piperidine, 2,4-dicarboxyl piperidine, 2,6-dicarboxyl piperidine, 3,5-dicarboxyl piperidine, 2-carboxyl pyrrolidine, 3-carboxyl pyrrolidine, 2,4-dicarboxyl pyrrolidine, 2,5-dicarboxyl pyrrolidine, 2-carboxyl pyrrole, 3-carboxyl pyrrole, 2,5-dicarboxypyrrole, and 3,4-dicarboxypyridine.

3. The chemical-mechanical polishing slurry as claimed in claim 1 wherein the pH value of the chemical-mechanical polishing slurry is 1.5 units higher than the pKa1 of the compound containing one or more carboxyl groups and lower than 6.5.

4. The chemical-mechanical polishing slurry as claimed in claim 1, wherein the mass percentage concentration of the silica particles is from 0.5 wt % to 8 wt %.

5. The chemical-mechanical polishing slurry as claimed in claim 4, wherein the mass percentage concentration of said silica particles is from 1 wt % to 5 wt %.

6. The chemical-mechanical polishing slurry as claimed in claim 1 wherein the mass percentage concentration of said compound containing one or more carboxyl groups is from 0.01 wt % to 0.5 wt %.

7. The chemical-mechanical polishing slurry as claimed in claim 6 wherein the mass percentage concentration of the compound containing one or more carboxyl groups is from 0.01 wt % to 0.3 wt %.

8. A chemical-mechanical polishing slurry consisting of silica particles, a compound containing one or more carboxyl groups, a pH adjustor, water, and a bactericide, wherein the compound containing one or more carboxyl groups is selected from the group consisting of a pyridine compound, a piperidine compound, a pyrrolidine compound, a pyrrole compound, and any derivative and/or combination thereof.

9. The chemical-mechanical polishing slurry as claimed in claim 8, wherein the pH adjustor is selected from the group consisting of $HNO_3$, $KOH$, $K_2HPO_4$, $KH_2PO_4$, and combinations thereof.

10. The chemical-mechanical polishing slurry as claimed in claim 8, wherein the bactericide is selected from the group consisting of 5-chloro-2-methyl-4-isothiazolin-3-ketone (CIT), 2-methyl-4-isothiazolinone (MIT), 1,2-Phenylpropanzothiazolinone (BIT), Iodopropargyl carbamate (IPBC), 1,3-dihydroxymethyl-5,5-methyl-heine (DMDMH), and combinations thereof.

11. The chemical-mechanical polishing slurry, as claimed in claim 8 wherein the mass percentage concentration of the bactericide is from 0.02 wt % to 0.2 wt %.

* * * * *